(12) United States Patent
Ikushima

(10) Patent No.: US 9,260,234 B2
(45) Date of Patent: Feb. 16, 2016

(54) LIQUID MATERIAL DISCHARGE APPARATUS AND METHOD

(71) Applicant: MUSASHI ENGINEERING, INC., Mitaka-shi, Tokyo (JP)

(72) Inventor: Kazumasa Ikushima, Mitaka (JP)

(73) Assignee: MUSASHI ENGINEERING, INC., Tokyo (JP)

(*) Notice: Subject to any disclaimer, the term of this patent is extended or adjusted under 35 U.S.C. 154(b) by 0 days.

(21) Appl. No.: 14/350,236

(22) PCT Filed: Oct. 5, 2012

(86) PCT No.: PCT/JP2012/075956
§ 371 (c)(1),
(2) Date: Apr. 7, 2014

(87) PCT Pub. No.: WO2013/051697
PCT Pub. Date: Apr. 11, 2013

(65) Prior Publication Data
US 2014/0252041 A1 Sep. 11, 2014

(30) Foreign Application Priority Data
Oct. 7, 2011 (JP) .................................. 2011-222468

(51) Int. Cl.
*B67D 3/00* (2006.01)
*B65D 83/00* (2006.01)
(Continued)

(52) U.S. Cl.
CPC .......... *B65D 83/0005* (2013.01); *B05C 5/0225* (2013.01); *B05C 11/1034* (2013.01); *H05K 3/3484* (2013.01); *H05K 2203/0126* (2013.01)

(58) Field of Classification Search
CPC B65D 83/005; B05C 5/0225; B05C 11/1034; H05K 3/3484; H05K 2203/0126

USPC .......... 222/309, 261–263, 389, 399, 504, 340
See application file for complete search history.

(56) References Cited

U.S. PATENT DOCUMENTS 3,851,801 A * 12/1974 Roth .......................... 222/146.5
4,030,640 A * 6/1977 Citrin et al. .................... 222/207
(Continued)

FOREIGN PATENT DOCUMENTS

JP 2002-282740 A 10/2002
JP 2003-25183 A 1/2003
(Continued)

OTHER PUBLICATIONS

International Search Report of PCT/JP2012/075956, mailing date of Dec. 25, 2012.
(Continued)

*Primary Examiner* — Patrick M Buechner
(74) *Attorney, Agent, or Firm* — Westerman, Hattori, Daniels & Adrian, LLP

(57) ABSTRACT

A liquid material discharge apparatus and a method which can easily adjust a movement speed of a plunger. The liquid material discharge apparatus includes a liquid chamber (50) which communicates with a discharging port (11) and to which a liquid material is supplied; a plunger whose rear end portion has a piston (33) and whose front end portion moves forward and rearward inside the liquid chamber (50); an elastic body (47) which applies a biasing force to the plunger; and a pressurizing chamber (49) in which the piston (33) is arranged and to which compressed gas is supplied. The liquid material is discharged through the discharging port (11) by the plunger to move forward fast, the elastic body (47) biases the plunger in a rearward movement direction, and the compressed gas applies a driving force to the piston (33) to cause the plunger to move forward.

23 Claims, 9 Drawing Sheets

(51) Int. Cl.
    *B05C 5/02*     (2006.01)
    *B05C 11/10*     (2006.01)
    *H05K 3/34*     (2006.01)

(56) References Cited

U.S. PATENT DOCUMENTS

| | | | |
|---|---|---|---|
| 4,784,582 A * | 11/1988 | Howseman, Jr. | 417/375 |
| 5,022,556 A * | 6/1991 | Dency et al. | 222/1 |
| 5,467,899 A * | 11/1995 | Miller | 222/309 |
| 5,747,102 A | 5/1998 | Smith et al. | |
| 6,060,125 A * | 5/2000 | Fujii | 427/8 |
| 6,253,957 B1 * | 7/2001 | Messerly et al. | 222/1 |
| 6,267,266 B1 * | 7/2001 | Smith et al. | 222/1 |
| 6,736,900 B2 * | 5/2004 | Isogai et al. | 118/663 |
| 2003/0132243 A1 * | 7/2003 | Engel | 222/61 |
| 2004/0134996 A1 | 7/2004 | Kazumasa | |
| 2010/0055299 A1 * | 3/2010 | Church et al. | 427/58 |
| 2010/0294810 A1 | 11/2010 | Ikushima | |
| 2012/0286072 A1 | 11/2012 | Saidman et al. | |

FOREIGN PATENT DOCUMENTS

| | | |
|---|---|---|
| JP | 2004-31927 A | 1/2004 |
| JP | 2009-219993 A | 10/2009 |
| JP | 2010-22881 A | 2/2010 |
| JP | 2010-253439 A | 11/2010 |
| WO | 2008/108097 A1 | 9/2008 |
| WO | 2011/071888 A1 | 6/2011 |

OTHER PUBLICATIONS

Supplementary European Search Report dated Jun. 23, 2015, issued in counterpart European application No. 12 83 8442 (1 page).

* cited by examiner (a) (b) (c) (d)

(e) (f) (g) (h)

LIQUID MATERIAL DISCHARGE APPARATUS AND METHOD

TECHNICAL FIELD

The present invention relates to a liquid material discharge apparatus and a liquid material discharge method which accurately discharge a very small amount of liquid materials in a range from low viscosity materials such as water, solvents and reagents to high viscosity materials such as solder pastes, silver pastes and adhesives.

BACKGROUND ART

In the related art, various techniques for discharging a small amount of liquid materials in a droplet shape through a discharging port by using a reciprocating plunger have been proposed.

For example, in a material distribution apparatus which distributes a small amount of liquid materials, an embodiment of PTL 1 discloses a configuration of an apparatus which introduces compressed air into an air chamber, moves a valve head away from a valve seat to open a valve, ejects the compressed air of the air chamber outward, causes a compression spring to press the valve against the valve seat, allows a shaft to generate a closing force and distributes the liquid material through an outlet end of a nozzle.

PTL 2 relating to the present applicant discloses a droplet discharge method in which a discharging port is opened by a rearward movement operation of a plunger rod using air pressure and a droplet is discharged through the discharging port by a forward movement operation of the plunger rod using an elastic force of a spring or the air pressure.

In a viscous fluid discharge apparatus, PTL 3 discloses a discharge apparatus that includes a cylindrical body which is formed in a cylindrical shape and has a viscous fluid containing chamber for containing a viscous fluid in a cylinder; a plunger which is inserted into the viscous fluid containing chamber and extrudes the viscous fluid; a piezoelectric driver which drives the plunger against a biasing force generated by a coil spring biasing the plunger in a direction opposite to a discharging direction of the viscous fluid; and a nozzle which is disposed in the cylindrical body to oppose the plunger and has a discharging port for discharging the viscous fluid.

PTL 4 relating to the present applicant discloses a droplet discharge apparatus that includes a plunger position determination mechanism which determines a position of a front end portion of a plunger when the plunger moves forward and stops in the vicinity of an inner wall of a liquid chamber located in a forward movement direction thereof.

CITATION LIST

Patent Literature

[PTL 1] JP-A-2004-31927
[PTL 2] JP-A-2002-282740
[PTL 3] JP-A-2009-219993
[PTL 4] Pamphlet of International Publication No. 2008/108097

SUMMARY OF INVENTION

Technical Problem

In an apparatus employing a method of discharging a liquid material by moving a valve head or a plunger fast, adjustment of a discharging amount is performed by adjusting a movement speed of the valve head or the plunger.

The apparatus disclosed in PTL 1 discharges the liquid material by utilizing the elastic force of the compression spring and moving the valve head quickly. However, it is not possible to adjust the movement speed of the valve head while maintaining a constant movement distance (stroke) of the valve head. That is, in order to move the valve head fast, it is necessary to increase a displacement amount of the compression spring by lengthening the stroke of the valve head. In addition, in order to move the valve head slowly, it is necessary to decrease the displacement amount of the compression spring by shortening the stroke of the valve head.

In addition, if it is based upon the premise that the stroke is lengthened, a problem also occurs in that the apparatus has to be increased in size or in that it is difficult to use fast tact in discharging the liquid material.

The apparatus disclosed in PTL 2 discharge the liquid material by causing the plunger rod to perform the forward movement operation using the elastic force of the spring. Accordingly, the apparatus has a problem similar to that of PTL 1.

The apparatus disclosed in PTL 3 has a configuration where the discharging is performed by forming a second chamber partitioned from a first chamber. Consequently, it is difficult to adjust the discharging amount. In addition, in the configuration of using the piezoelectric driver, the stroke cannot be increased up to a certain level or higher, thereby limiting types of the liquid materials which can be discharged.

The present invention is made in view of the above-described circumstances, and an object thereof is to provide a liquid material discharge apparatus and a liquid material discharge method which can easily adjust a movement speed of a plunger.

Solution to Problem

According to a first aspect of the invention, there is provided a liquid material discharge apparatus that includes a liquid chamber which communicates with a discharging port and to which a liquid material is supplied; a plunger whose rear end portion has a piston and whose front end portion moves forward and rearward inside the liquid chamber; an elastic body which applies a biasing force to the plunger; and a pressurizing chamber in which the piston is arranged and to which compressed gas is supplied. The liquid material is discharged through the discharging port by causing the plunger to move forward fast, the elastic body biases the plunger in a rearward movement direction, and the compressed gas supplied to the pressurizing chamber applies a driving force to the piston to cause the plunger to move forward.

According to a second aspect of the invention, the first aspect of the invention further includes a stroke adjustment mechanism which comes into contact with the piston and adjusts the most rearward movement position of the piston.

According to a third aspect of the invention, the first or second aspect of the invention further includes a position determining mechanism which includes a contact portion disposed in the plunger and a position determining member opposing the contact portion, and which determines the most forward movement position of the plunger.

According to a fourth aspect of the invention, in the third aspect of the invention, the contact portion comprises a convex member disposed in a forward movement direction of the piston, and the position determining member comprises a wall surface opposing the piston of the pressurizing chamber.

According to a fifth aspect of the invention, the third aspect of the invention further includes a distance adjustment mechanism which adjusts a distance between the position determining member and the pressurizing chamber.

According to a sixth aspect of the invention, in the fifth aspect of the invention, the contact portion comprises a convex member disposed in a forward movement direction of the piston.

According to a seventh aspect of the invention, in the fifth aspect of the invention, the plunger has a rod portion connecting the piston and the front end portion, and the contact portion is disposed in the rod portion.

According to an eighth aspect of the invention, any one of the first to seventh aspects of the invention further includes a biasing force adjustment mechanism which includes a moving member holding the elastic body by opposing the piston and a position adjustment mechanism adjusting a position of the moving member, and which adjusts a biasing force of the elastic body.

According to a ninth aspect of the invention, any one of the first to eighth aspects of the invention further includes a pressure intensifier which intensifies a pressure of the compressed gas to be supplied to the pressurizing chamber; and a pressure regulator which reduces a pressure of the compressed gas whose pressure is intensified by the pressure intensifier, to be a desired pressure, and which supplies the compressed gas to the pressurizing chamber.

According to a tenth aspect of the invention, in the ninth aspect of the invention, a buffer tank is disposed in a flow path which allows the pressure intensifier and the pressurizing chamber to communicate with each other.

According to an eleventh aspect of the invention, any one of the first to tenth aspects of the invention further includes a flow valve which controls a flow rate of the compressed gas ejected from the pressurizing chamber.

According to a twelfth aspect of the invention, any one of the first to eleventh aspects of the invention, the pressurizing chamber is divided into two air-tight spaces by the piston; and the liquid material discharge apparatus further includes a flow valve which controls a flow rate of gas flowing in the pressurizing chamber when the piston rises.

According to a thirteenth aspect of the invention, there is provided a liquid material discharge method using a liquid material discharge apparatus that includes a liquid chamber which communicates with a discharging port and to which a liquid material is supplied; a plunger whose rear end portion has a piston and whose front end portion moves forward and rearward inside the liquid chamber; an elastic body which applies a biasing force to the plunger; and a pressurizing chamber in which the piston is arranged and to which compressed gas is supplied. The method includes a filling process of causing the plunger to move in a rearward movement direction by ejecting the compressed gas inside the pressurizing chamber; and a discharging process of causing the plunger to move forward by supplying the compressed gas to the pressurizing chamber.

According to a fourteenth aspect of the invention, in the thirteenth aspect of the invention, the liquid material discharge apparatus further includes a position determining mechanism which includes a contact portion disposed in the plunger and a position determining member opposing the contact portion, and which determines the most forward movement position of the plunger; and a liquid material is discharged in a droplet state after applying inertia force to the liquid material by causing the plunger to move forward in a state where the front end portion of the plunger and an inner wall of the liquid chamber are not in contact with each other.

According to a fifteenth aspect of the invention, in the fourteenth aspect of the invention, the discharging process includes a process of extruding the liquid material having an amount required for forming a desired droplet from the discharging port by causing the plunger to move forward to the most forward movement position where the plunger is not in contact with the liquid chamber; and a process of forming a very small amount of droplets after dividing the liquid material extruded from the discharging port by subsequently causing the plunger to move rearward.

According to a sixteenth aspect of the invention, in any one of the thirteenth to fifteenth aspects of the invention, the liquid material discharge apparatus further includes a pressure intensifier which intensifies a pressure of the compressed gas to be supplied to the pressurizing chamber, and a pressure regulator which reduces a pressure of the compressed gas whose pressure is intensified by the pressure intensifier, to be a desired pressure, and which supplies the compressed gas to the pressurizing chamber; and the discharging process includes a process of supplying the compressed gas whose pressure has been regulated.

According to a seventeenth aspect of the invention, in the sixteenth aspect of the invention, a buffer tank is disposed in a flow path which allows the pressure intensifier and the pressurizing chamber to communicate with each other.

According to an eighteenth aspect of the invention, in any one of the thirteenth to seventeenth aspects of the invention, the liquid material discharge apparatus further includes a flow valve which controls a flow rate of the compressed gas ejected from the pressurizing chamber; and the filling process includes a process of controlling the flow rate of the compressed gas ejected from the pressurizing chamber.

According to a nineteenth aspect of the invention, in any one of the thirteenth to eighteenth aspects of the invention, the pressurizing chamber is divided into two air-tight spaces by the piston; the liquid material discharge apparatus further includes a flow valve which controls a flow rate of gas flowing in the pressurizing chamber when the piston rises; and the filling process includes a process of controlling the flow rate of the gas flowing into from the pressurizing chamber.

Advantageous Effects of Invention

According to the present invention, it is possible to provide a liquid material discharge apparatus which can easily adjust a movement speed of a plunger and a method for the same. More specifically, it is possible to adjust the movement speed of the plunger by independently adjusting a stroke of the plunger.

DESCRIPTION OF EMBODIMENTS

Figure 1:
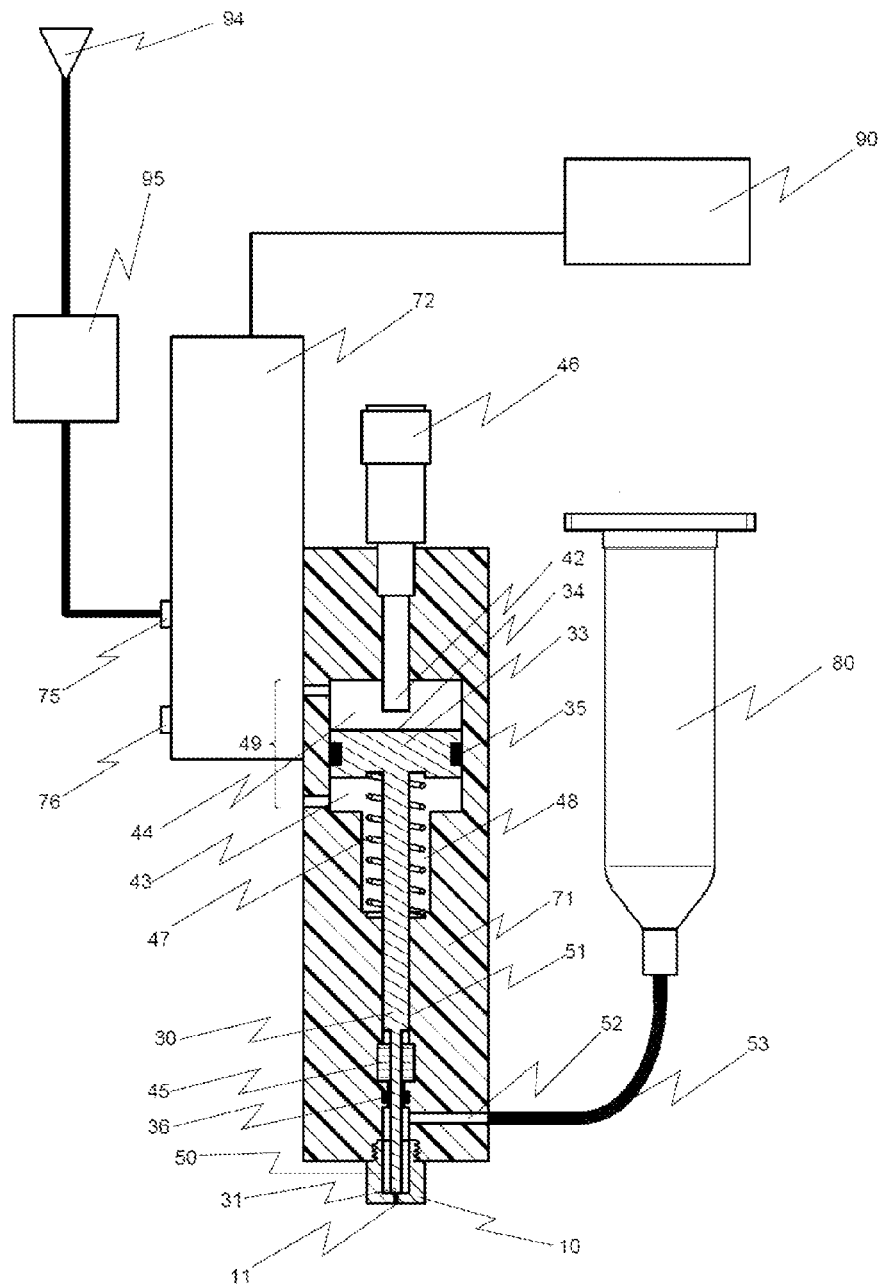
FIG. 1 is a configuration diagram of an apparatus in Example 1.

A liquid material discharge apparatus will be described as an example of an embodiment of the present invention. Hereinafter, for convenience of description, a liquid material discharging direction is sometimes referred to "downward" or "forward", and the opposite direction is sometimes referred to as "upward" or "rearward".

The discharge apparatus of the present invention includes a liquid chamber which communicates with a discharging port (nozzle) and to which a liquid material is supplied; a plunger whose rear end portion has a piston and whose front end portion moves forward and rearward inside the liquid chamber; an elastic body which applies a biasing force to the plunger; and a pressurizing chamber in which the piston is arranged and to which compressed gas is supplied. The elastic body biases the plunger in a rearward movement direction and the discharge apparatus discharges the liquid material in such a manner that the compressed gas supplied to the pressurizing chamber applies a driving force to the piston to cause the plunger to move forward.

The apparatus of the present invention can easily change a forward movement speed of the piston (that is, the plunger) without changing a stroke, by adjusting an air pressure of the pressurizing chamber. In other words, the apparatus of the present invention can easily adjust a discharging amount by adjusting the air pressure and changing the forward movement speed of the plunger.

In the apparatus of the present invention using a compressed elastic body such as a compression coil spring, when the plunger is located at a forward movement position, the elastic body is in a state where a deflection degree is large. When the plunger is located at a rearward movement position, the elastic body is in a stretched state. As described above, the elastic body is almost in a natural state when the plunger is located at the rearward movement position. Accordingly, when the discharging operation is repeatedly performed multiple times, it is easy to prepare for a subsequent discharging operation.

In addition, the biasing force applied to the plunger by the elastic body also acts so as to accelerate ejection of the compressed air inside the pressurizing chamber. Therefore, it is possible to cause the plunger to quickly move rearward. The apparatus of the present invention is preferably used in continuously discharging the liquid material fast (for example, 100 shots or more per second).

As the elastic body, a leaf spring or rubber can be used in addition to the coil spring. As will be described later in Example 8, the elastic body can employs a tension type elastic body such as tension coil spring.

It is preferable to dispose a position determining mechanism which determines the most forward movement position of the plunger. In this case, it is possible to perform not only a method of causing the plunger to collide with a valve seat so as to discharge in a flying way the liquid material through a nozzle, but also a method of causing the plunger to move fast and rapidly stopping the plunger without colliding with the valve seat so as to apply an inertia force to the liquid material and to discharge in a flying way the liquid material through the nozzle.

It is preferable to dispose a stroke adjustment mechanism which comes into contact with the piston and adjusts the most rearward movement position of the piston. In this case, it is possible to adjust the stroke of the plunger.

It is preferable to dispose a biasing force adjustment mechanism which adjusts a biasing force of the elastic body. In this case, it is possible to adjust a rearward movement speed of the plunger by adjusting elastic force (restoring force) acting on the rearward movement of the piston.

A flow valve which controls a flow rate of the compressed gas ejected from the pressurizing chamber may be disposed. This flow valve enables adjusting the rearward movement speed of the plunger. In addition, a flow valve may be disposed which divides the pressurizing chamber into two airtight spaces by using the piston, and controls a flow rate of gas flowing into a front (lower) space when the piston rises, and the rearward movement speed of the plunger may be adjusted by this flow valve.

The present invention can also be used in discharging a very small amount of high viscosity liquid which is not suitable for ink jet type discharging, such as a cream solder. Here, for example, the high viscosity liquid means a liquid having viscosity of 10,000 mPa·s to 500,000 mPa·s, particularly a liquid having viscosity of 20,000 mPa·s to 500,000 mPa·s, and further a liquid having viscosity of 30,000 mPa·s to 500,000 mPa·s.

In addition, discharging a very small amount means discharging a droplet whose landing diameter is tens to hundreds of μm, or a droplet whose volume is 1 nl or less (preferably, 0.1 nl to 0.5 nl). According to the present invention, the droplet can be formed even when a discharging port diameter is several tens of μm or less (preferably, 30 μm or less).

Figure 9:
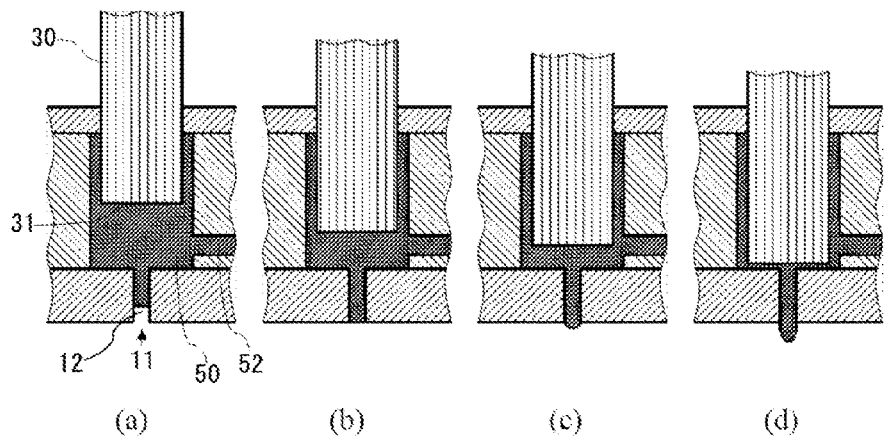
FIG. 9 is a view illustrating a relationship between a position of a plunger and a state of a liquid material.
Figure 9:
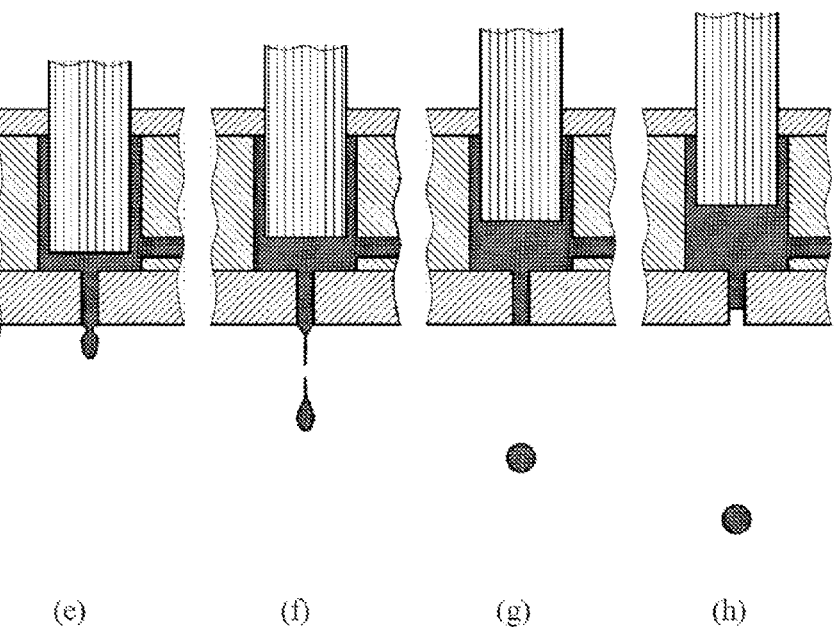

When discharging the very small amount of high viscosity liquid, it is preferable to perform the discharge method which includes an extruding process for extruding the liquid material having an amount required for forming a desired droplet from the discharging port by causing the plunger to move forward, and a dividing process for forming the very small amount of droplets after dividing the liquid material extruded from the discharging port by causing the plunger to move rearward. Here, after the dividing process, it is preferable to perform a suction process for stopping the movement of the plunger after forming a gas-liquid interface inside a discharging path by causing the plunger to further move rearward. The discharge method will be described with reference to FIG. 9.

FIG. 9(a) illustrates an initial state when the discharging operation starts. In the initial state, a front end portion 31 of the plunger is located at an operation start position which is farthest from a discharging path 12 during a series of discharging operations. At this time, a discharging port 11 side of the discharging path 12 may be in a state where a very small amount of open air (air) is sucked.

FIG. 9(b) illustrates a state where the plunger is caused to move forward from the operation start position of the plunger in FIG. 9(a) and the liquid material inside the discharging path 12 is caused to reach the discharging port (side end surface of the discharging port of the discharging path 12).

FIG. 9(c) illustrates a state where the plunger is caused to further move forward from the position of the plunger in FIG. 9(b). In this state, the liquid material reaching the discharging port is extracted outward from the discharging port without being divided.

FIG. 9(d) illustrates a state where the plunger is stopped at the most forward movement position after the plunger is caused to further move forward from the position of the plunger in FIG. 9(c). In this state, an amount of the liquid material required for forming a droplet having a desired size is extracted outward from the discharging port 11.

FIG. 9(e) illustrates a state where the plunger is caused to move slightly rearward from the position (most forward movement position) of the plunger in FIG. 9(d). If the plunger moves rearward, a volume ratio of the plunger occupying the inside of the liquid chamber 50 decreases, thereby applying a force to the liquid material inside the discharging path 12 and the liquid material which is present outside the discharging port 11 in a direction toward the inside of the liquid chamber 50. Therefore, the inertia force acts on the liquid material extracted from the discharging port in the forward movement direction of the plunger, the force is applied in the rearward movement direction of the plunger, and thus a droplet starts to be formed (subjected to cutting action in a portion in the vicinity of the discharging port).

FIG. 9(f) illustrates a state where the plunger is caused to further move rearward from the position of the plunger in FIG. 9(e). If the plunger further moves rearward, the cutting action becomes stronger with respect to the liquid material extracted from the discharging port 11. In this manner, the liquid material extracted from the discharging port 11 which is continuous from the discharging path 12 is divided at a portion in the vicinity of the discharging port, thereby forming a droplet.

FIG. 9(g) illustrates a state where the plunger is caused to further move rearward from the position of the plunger in FIG. 9(f). Out of the liquid materials extracted from the discharging port 11, the liquid material remaining on the discharging path 12 side is sucked into the discharging path 12 by the rearward movement of the plunger.

In preparation for subsequent discharging, it is preferable to leave the discharging port 11 side of the discharging path 12 in a state where a very small amount of open air (air) is sucked. That is, it means a state where the gas-liquid interface is present inside the discharging path 12. In this manner, it is possible to prevent the liquid material from being dried, and additionally, it is possible to prevent contamination of the surrounding environment which is caused by liquid dripping during standby time in the discharging operation. At this time, attention is required to be paid so that the open air (air) is not sucked into the liquid chamber 50 through the discharging path 12.

FIG. 9(h) illustrates a state where the plunger is caused to further move rearward from the position of the plunger in FIG. 9(g) and is caused to reach an operation end position. FIGS. 9(a) to 9(h) illustrate a series of operations for forming one droplet. The position of the plunger when one-time discharging is completed is a position further rearward than the most forward movement position.

Hereinafter, the embodiment of the present invention will be described in detail by using examples, but the present invention is not limited by the examples.

Example 1

An apparatus of Example 1 discharges the liquid material through the discharging port 11 by causing the plunger (piston 33) biased in the rearward movement direction by a spring 47 to move forward using compressed air supplied from a pressure supply source 94. Hereinafter, a configuration of the apparatus in Example 1 will be first described, and then an operation will be described.

<<Configuration>>

FIG. 1 is a configuration diagram of the apparatus in Example 1. A main body 71 is a block-shaped member, and internally has a piston chamber 49 which is a pressurizing chamber. A piston 33 forming a rear end portion of the plunger is arranged in the piston chamber 49 so as to be vertically slidable. The piston 33 divides the piston chamber 49 into a front piston chamber 43 and a rear piston chamber 44. A sealing member A35 is formed in an annular shape on a side surface of the piston 33. This allows the front piston chamber 43 and the rear piston chamber 44 to hold air-tightness.

The compressed air is supplied to the rear piston chamber 44 from an electromagnetic switching valve 72. The movement speed of the plunger is proportional to a magnitude of the pressure of the air supplied to the rear piston chamber 44. The electromagnetic switching valve 72 communicates with the pressure supply source 94 supplying the compressed air, via a pressure regulator (regulator) 95. For example, the pressure regulator 95 is configured to have a pressure reducing valve or a combination of the pressure reducing valve and a buffer tank. Based on a command from a control unit 90, the electromagnetic switching valve 72 is operated so as to switch between a first position where the pressure regulator 95 and the rear piston chamber 44 communicate with each other and a second position where the rear piston chamber 44 and the external environment (atmosphere) communicate with each other.

In this example, the electromagnetic switching valve 72 is directly fixed to the main body 71, but may be arranged at a position away from the main body 71 via a tube (pumping tube) or the like.

A rear stopper 42 which comes into contact with a rear contact portion 34 which is a rear end of the piston 33, and which determines the most rearward movement position of the piston 33 is arranged in the rear piston chamber 44. The rear stopper 42 is connected to a micrometer 46 which is arranged by being inserted into a rear end portion of the main body 71, thereby functioning as a stroke adjustment mechanism. That is, a position of a tip of the rear stopper 42 is vertically moved by turning around the micrometer 46. In this manner, it is possible to adjust the stroke of the plunger.

The front piston chamber 43 is a space for communicating with a spring chamber 48. A spring 47 is arranged in the front piston chamber 43 and the spring chamber 48. A rod portion 30 of the plunger is inserted into the spring 47. The spring 47 is a compression coil spring, one end of which is in contact with or is fixed to a bottom portion of the spring chamber 47, and the other end of which is in contact with or is fixed to the piston 33.

When the electromagnetic switching valve 72 is located at the first position, the spring 47 is compressed by the piston 33 to be in a state of storing elastic energy. If the position of the electromagnetic switching valve 72 is switched over to the second position, the elastic energy of the spring 47 which is stored by the compression causes the piston 33 to move rearward. This prompts the rear piston chamber 44 to eject the compressed air. Therefore, it is possible to quickly proceed to a subsequent discharging operation, and thus, it is possible to shorten a tact time.

The rod portion 30 of the plunger is inserted into an insertion hole 51 of the main body 71. The rod portion 30 is configured to have a large-diameter portion and a small-diameter portion. The small-diameter portion is inserted into a guide 45, and this guides the plunger moving forward and rearward so as not to be shaken rightward and leftward. A tip of the small-diameter portion configures the front end portion 31 moving forward and rearward inside the liquid chamber 50.

In the present example, an inner bottom surface of the liquid chamber 52 having the discharging path 12 configures a valve seat. The front end portion 31 comes into contact with a bottom portion of the liquid chamber 50, thereby dividing the liquid material and causing the liquid material to be discharged through the discharging port 11. The most forward movement position of the plunger in Example 1 is determined by the front end portion 31 coming into contact with the inner bottom surface of the liquid chamber 52.

The liquid chamber 50 communicates with a liquid feeding path 52, and the liquid material is supplied from a storage container 80 to the liquid chamber 50 via a liquid feeding tube 53. In Example 1, the liquid material inside the storage container 80 is supplied into the liquid chamber 50 by its own weight without being pressurized, but the storage container 80 may be configured to be pressurized as in Example 2 described below. As long as the liquid feeding tube 53 can fluidly connect the main body and the storage container, any member can be used and a non-tubular shape may be employed. A sealing member B36 prevents the liquid material inside the liquid chamber 50 from entering the insertion hole 51.

<<Preparation Process>>

First, the liquid chamber 50 is filled with the liquid material. That is, the liquid material is supplied from the storage container 80 to the liquid chamber 50 via the liquid feeding tube 53 and the liquid feeding path 52, and the liquid chamber 50 is filled with the liquid material up to the discharging port 11.

Next, the electromagnetic switching valve 72 is located at the first position where the pressure regulator 95 and the rear piston chamber 44 communicate with each other so as to cause the plunger to move forward. Then, the front end portion 31 of the plunger is brought into contact with the inner bottom surface of the liquid chamber 52 to close the discharging port 11.

It is possible to continuously discharge the liquid material by completing the above-described preparation process.

<<Main Operation>>

In a state where the liquid chamber 50 is fully filled with the liquid material, the position of the electromagnetic switching valve 72 is switched over to the second position where the rear piston chamber 44 and the open air (atmosphere) communicate with each other. In this manner, the air inside the rear piston chamber 44 is ejected outward, the spring 47 presses the piston 33 upward, and the front end portion 31 of the plunger is separated from the inner bottom surface of the liquid chamber 50. The piston 33 rises until the rear contact portion 34 comes into contact with the rear stopper 42, and then stops. In response to a decrease in the volume of the plunger occupying the inside of the liquid chamber 50, the liquid material flows into the liquid chamber 50 from the storage container 80.

Next, if the position of the electromagnetic switching valve 72 is switched over to the first position, the force applied by the compressed air supplied to the rear piston chamber 44 to the piston 33 prevails against the biasing force of the spring 47, thereby causing the plunger to move forward. If the front end portion 31 of the plunger comes into contact with the inner bottom surface of the liquid chamber 50, the movement of the plunger is stopped, the liquid material flowing out from the discharging port 11 is divided, and the liquid material is discharged in a flying way. The above-described operation is an operation for one-time discharging.

The position of the electromagnetic switching valve 72 is switched over to the second position again, and the liquid chamber 50 is refilled with the liquid material. Then, second-time discharging is performed by switching the position of the electromagnetic switching valve 72 over to the first position.

Subsequently, this operation is continuously repeated, thereby enabling the liquid material to be continuously discharged.

According to the apparatus of Example 1 as described above, it is possible to more easily adjust the forward movement speed of the plunger by adjusting the pressure of the compressed air while fixing the stroke of the plunger.

Example 2

An apparatus of Example 2 is different from the apparatus of Example 1 in that the front end portion 31 of the plunger does not come into contact with the inner bottom surface of the liquid chamber 50 when the liquid material is discharged. That is, the apparatus of Example 2 includes a plunger position determination mechanism for determining the position of the front end portion 31 of the plunger, and discharges the liquid material in a droplet state after applying the inertia force to the liquid material by causing the plunger to move forward and stop the forward movement in a state where the front end portion of the plunger and an inner wall of the liquid chamber are not in contact with each other.

Figure 2:
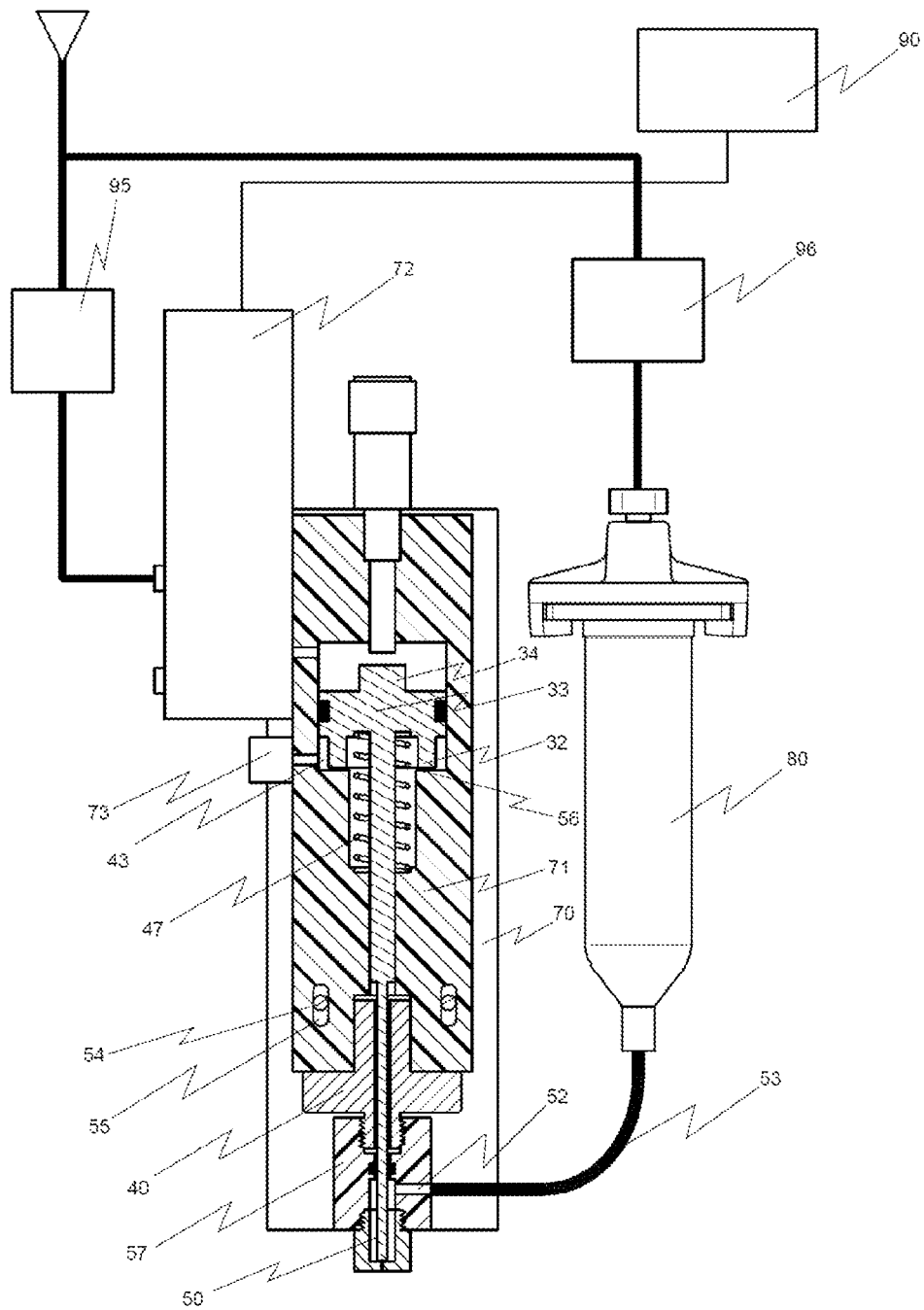
FIG. 2 is a configuration diagram of an apparatus in Example 2.

FIG. 2 is a configuration diagram of the apparatus in Example 2. In this apparatus, by using a fixing screw 54 inserted into a slot 55 disposed in the main body 71, it is possible to adjust the position of the main body 71 with respect to a base 70. That is, the main body 71 is movable with respect to the base 70 by loosening the fixing screw 54, the position of the main body 71 is adjusted by a position determining member 40, and the fixing screw 54 is fastened to fix the main body 71 to the base 70.

The position determining member 40 is arranged between the main body 71 and a discharging unit 57. The position determining member 40 is configured to have a front projection having a cylindrical shape, a rear projection having a cylindrical shape and a disk-shaped rotary knob which connects these projections. A through hole is disposed on a central axis of the position determining member 40, and the rod portion 30 of the plunger is inserted into the through hole. The front projection has the cylindrical shape and has a screw groove for screwing to a rear recess whose outer peripheral surface includes the discharging unit 57. A surface of the rotary knob is configured to have a scale corresponding to a position display member (movement amount check member) so as to check a rotated angle from outside. It is possible to quantitatively check a change in the position of the position determining member 40 by using the rotary knob. The rear projection is inserted into a recess disposed in the main body 71.

The piston 33 has a front contact portion 32 protruding forward and a rear contact portion 34 protruding rearward. The front contact portion 32 comes into contact with the inner bottom surface of the front piston chamber 43, thereby determining the most forward movement position of the plunger. That is, the inner bottom surface of the front piston chamber 43 configures a front stopper 56. Here, by adjusting the position of the position determining member 40, it is possible to adjust a distance between the front end portion 31 and the inner bottom surface of the liquid chamber 50 at the most forward movement position of the plunger. That is, the front contact portion 32, the front stopper 56 and the position determining member 40 configure the position determining mechanism for determining the most forward movement position of the plunger.

A nozzle member 10 is screwed to and inserted into the front end portion of the discharging unit 57. The liquid material is supplied from the storage container 80 to the liquid chamber 50 inside the nozzle member 10.

In example 2, the compressed air whose pressure is regulated to be a desired pressure by a pressure regulator B96 is supplied to the storage container 80. For example, the pressure regulator B96 is configured to have a pressure reducing valve or a combination of the pressure reducing valve and a buffer tank. The control unit 90 can change a supply pressure depending on the properties of the liquid material. For example, when discharging the high viscosity material, a relatively high pressure is supplied.

According to the apparatus of Example 2 as described above, the front end portion of the plunger does not come into contact with the valve seat. Therefore, the rod of the plunger or the valve seat is not worn. In addition, it is possible to excellently discharge the liquid material even a filler-contained liquid material such as a cream solder.

Example 3

An apparatus of Example 3 includes a moving member 41 which varies a size of the piston chamber 49, below (in front of) the piston chamber 49. In addition, the apparatus of Example 3 is different from the apparatus of Example 2 in that there are provided an electromagnetic switching valve B98 which applies a desired pressure to the storage container 80 and a pressure reducing valve B99.

Figure 3:
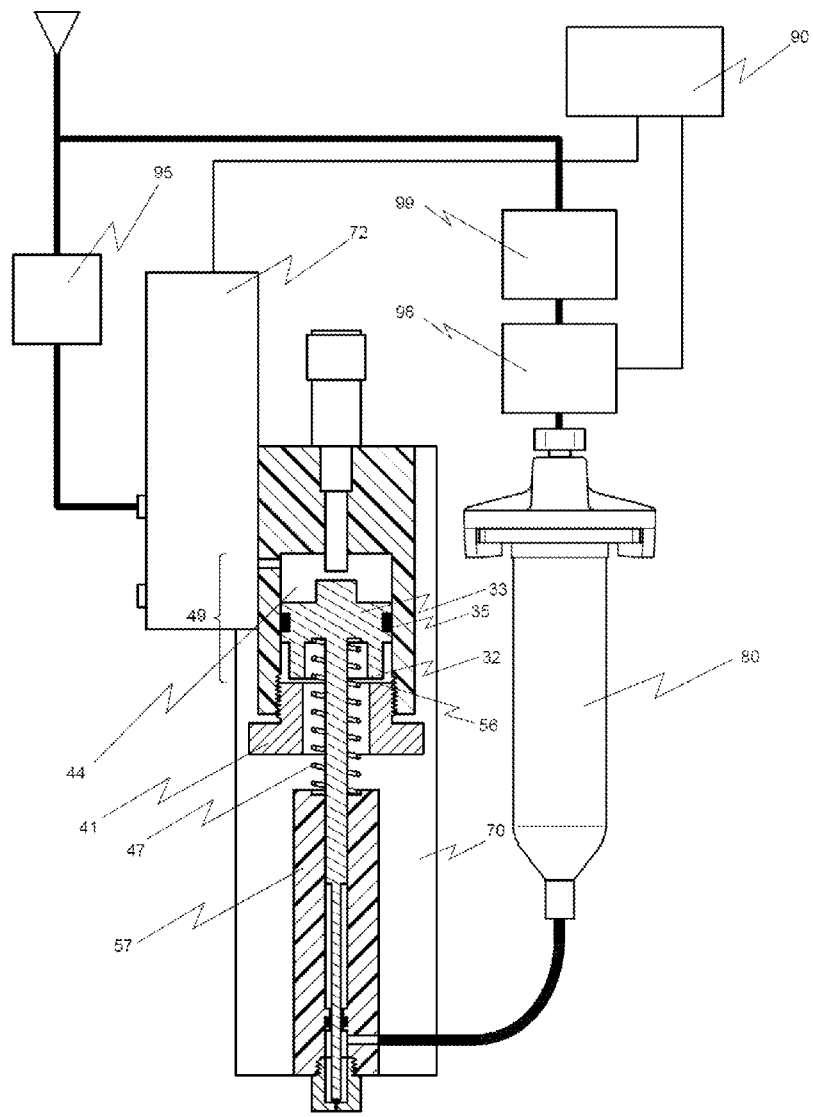
FIG. 3 is a configuration diagram of an apparatus in Example 3.

FIG. 3 is a configuration diagram of the apparatus in Example 3. The main body 71 of this example is configured to have a vertical length which is sufficiently short as compared to the base 70 (length of the main body 71 is half of the length of the base 70 or shorter), and has a space in which a bottom surface configuring the piston chamber 49 is open. The piston 33 arranged to be slidable in the space inside the main body 71 has a sealing member A35 on a side peripheral surface, thereby forming the air-tight rear piston chamber 44. A screw groove is formed on an inner periphery of a lower end portion of the main body 71, and the moving member 41 having a screw groove on an outer periphery is screwed and inserted.

It is possible to change the size of the piston chamber 49 by using a screw mechanism (position adjustment mechanism) configured to have the outer peripheral screw groove of the moving member 41 and the inner peripheral screw grove of the lower end portion of the main body 71. In this example, the piston chamber 49 is narrowed by rotating and tightening the moving member 41 in a forward direction, and the piston chamber 49 is widened by loosening and rotating the moving member 41 in a reverse direction.

The spring 47 is inserted into a through hole in a vertical direction of the moving member 41. In the spring 47, one end thereof is in contact with or is fixed to the piston 33, and the other end thereof is in contact with or is fixed to the discharging unit 57.

Similar to Example 2, the piston 33 of this example also has the front contact portion 32 protruding forward. The front contact portion 32 comes into contact with a rear end surface of the moving member 41, thereby determining the most forward movement position of the plunger. That is, the rear end surface of the moving member 41 configures the front stopper 56. Then, the front contact portion 32, the front stopper 56 and the moving member 41 configure the position determining mechanism for determining the most forward movement position of the plunger.

In this example, it is possible not only to perform the discharging by allowing the plunger to be seated, but also to perform the discharging without allowing the plunger to be seated. For example, the moving member 41 is largely loosened to move downward, the contact portion 32 of the piston 33 is enabled to largely move forward. In this manner, it is possible to determine the most forward movement position where the front end portion 31 of the plunger comes into contact with the inner bottom surface of the liquid chamber 50. If the moving member 41 is tightened and the most forward movement position of the plunger is caused to move rearward from this state, it is possible to determine the most forward movement position where the front end portion 31 of the plunger does not come into contact with the inner bottom surface of the liquid chamber 50.

The nozzle member 10 is screwed to and inserted into the front end portion of the discharging unit 57. The liquid material is supplied from the storage container 80 to the liquid chamber 50 inside the nozzle member 10.

In example 3, the compressed air whose pressure is regulated by the pressure reducing valve B99 is supplied to the storage container 70 via the electromagnetic switching valve B98. The electromagnetic switching valve B98 is operated based on a command from the control unit 90, and switches between a position where the pressure reducing valve B99 and the storage container 80 communicate with each other and a position where the storage container 80 and the open air communicate with each other. When the storage container 80 is replaced by another storage container, it is possible to prevent unnecessary consumption of the compressed air by switching the position of the electromagnetic switching valve B98 over to the position where the storage container 80 and the open air communicate with each other.

According to the apparatus of Example 3 as described above, it is possible to achieve the same effect as that of Example 2. In addition, when the storage container is replaced by another storage container, it is possible to prevent unnecessary consumption of the compressed air.

Example 4

An apparatus of Example 4 is different from the apparatus of Example 3 in that there are provided a pressure regulator (pressure reducing valve) 91, a buffer tank 92 and a pressure intensifier 93 instead of the pressure regulator 95.

Since the movement speed of the plunger is proportional to the magnitude of the pressure of the air supplied to the rear piston chamber 44, it is necessary to supply highly compressed air in order to move the plunger fast. Therefore, in this example, instead of the pressure regulator 95 of Example 3, the pressure reducing valve 91, the buffer tank 92 and the pressure intensifier 93 are disposed.

Figure 4:
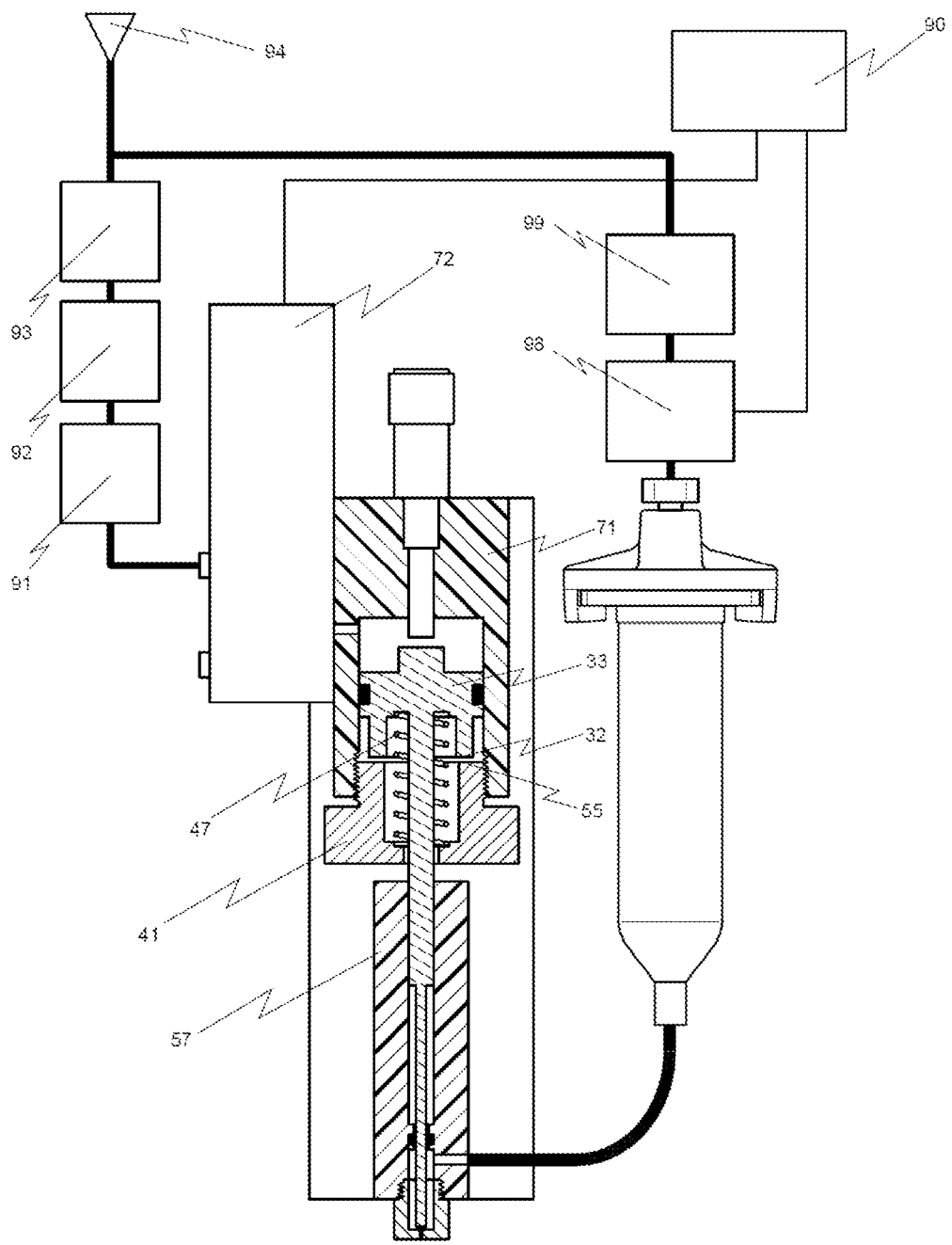
FIG. 4 is a configuration diagram of an apparatus in Example 4.

FIG. 4 is a configuration diagram of the apparatus in Example 4. The pressure reducing valve 91 is a pressure reducing valve for eliminating variations in the pressure of the compressed air whose pressure is intensified, adjusts the intensified compressed air to have a desired pressure, and supplies the compressed air to the electromagnetic switching valve 72. The pressure intensifier 93 intensifies the pressure of the air supplied from the pressure supply source 94. The buffer tank 92 arranged in the flow path which allows the pressure intensifier 93 and the pressure reducing valve 91 to communicate with each other prevents occurrence of pulsations by temporarily storing the intensified compressed air. Here, the buffer tank 92 may be disposed in the flow path which allows the pressure reducing valve 91 and the electromagnetic switching valve 72 to communicate with each other. Furthermore, a first buffer tank may be disposed in the flow path which allows the pressure intensifier 93 and the pressure reducing valve 91 to communicate with each other, and a second buffer tank may be disposed in the flow path which allows the pressure reducing valve 91 and the electromagnetic switching valve 72 to communicate with each other.

In addition, in the apparatus of this example, the spring 47 is held between the moving member 41 and the piston 33. Accordingly, the apparatus has a configuration where the stroke of the plunger and the biasing force of the spring 47 are simultaneously adjusted by adjusting the distance of the moving member 41 with respect to the main body 71. That is, if the moving member 41 is moved downward with respect to the main body 71, the most forward movement position of the plunger moves forward, and the biasing force of the spring is weakened. If the moving member 41 is moved upward with respect to the main body 71, the most forward movement position of the plunger moves rearward, and the biasing force of the spring is strengthened.

The apparatus of this example includes the pressure reducing valve 91 which regulates the pressure of the intensified compressed air and the buffer tank 92 which temporarily stores the intensified compressed air. Therefore, it is possible to stably supply the highly compressed air required for moving the plunger fast.

Example 5

An apparatus of Example 5 is different from those of the respective examples as described above in that there is provided a mechanism (biasing force adjustment mechanism) which adjusts the biasing force of the spring by independently adjusting the stroke of the plunger. In addition, it is also different in that there is provided a controller 97 obtained by aggregating the electromagnetic switching valve, the pressure regulator, the pressure intensifier and the control unit.

The apparatus of this example is similar to that of Example 3 in that the vertical length of the main body 71 is sufficiently short as compared to the base 70, but is different from that of Example 3 in that the front contact portion 32 is disposed in the rod portion 30 of the plunger.

Figure 5:
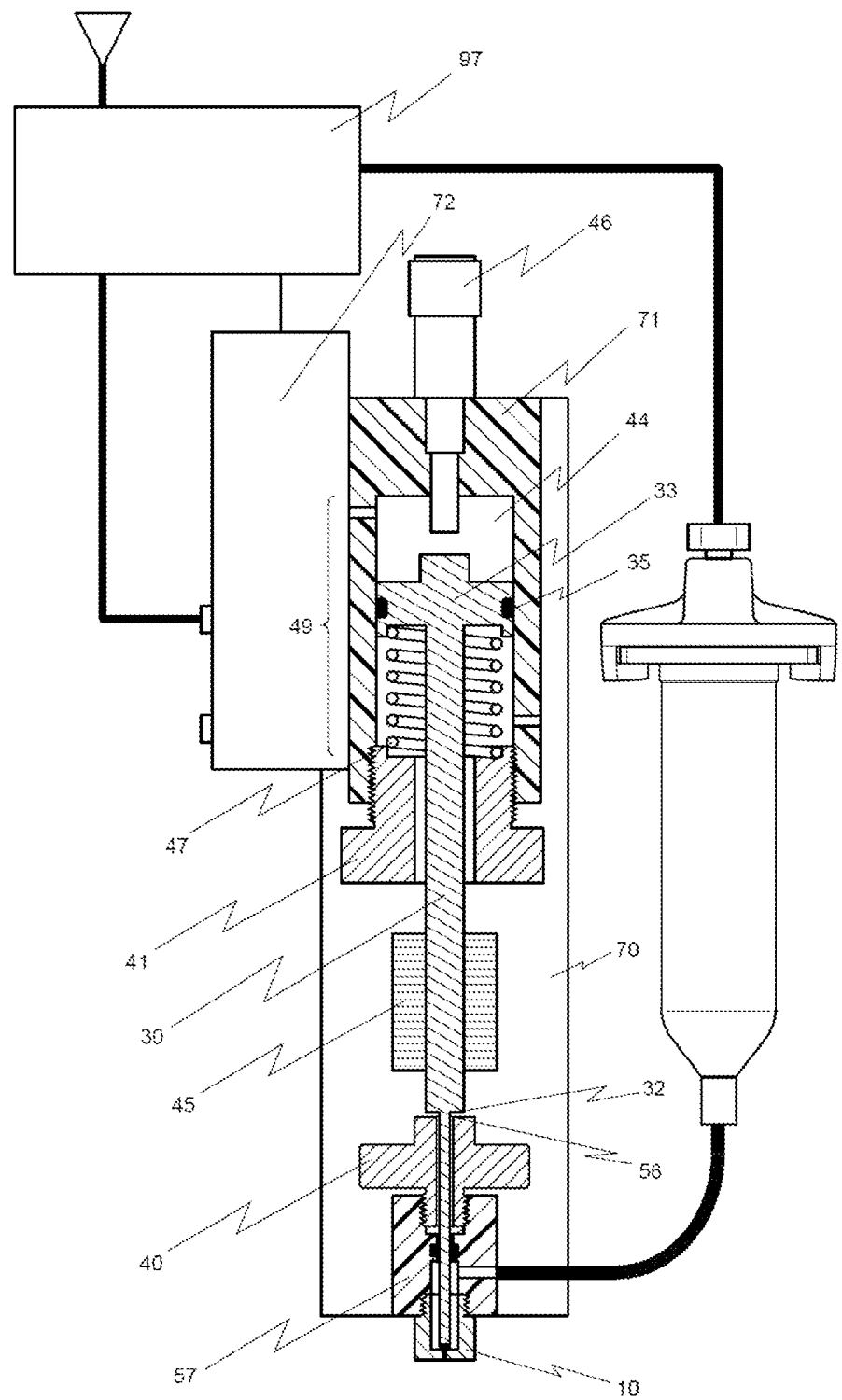
FIG. 5 is a configuration diagram of an apparatus in Example 5.

FIG. 5 is a configuration diagram of the apparatus in Example 5. The main body 71 of this example is configured to have the vertical length which is sufficiently short as compared to the base 70 (length of the main body 71 is half of the length of the base 70 or shorter), and has a space in which a bottom surface configuring the piston chamber 49 is open. The piston 33 arranged to be slidable in the space inside the main body 71 has the sealing member A35 on the side peripheral surface, thereby forming the air-tight rear piston chamber 44. A screw groove is formed on the inner periphery of the lower end portion of the main body 71, and the moving member 41 having a screw groove on the outer periphery is screwed and inserted.

This example is similar to Example 3 and Example 4 in that the screw mechanism which can adjust the distance between the moving member 41 and the main body 71 is provided to change the size of the piston chamber 49. In addition, this example is similar to Example 4 in that the spring 47 is held by being interposed between the rear end surface of the moving member 41 and the front end surface of the piston 33. However, this example is different from Example 4 in that the most forward movement position of the plunger is determined by the position determining member 40.

In this example, if the moving member 41 is rotated in the forward direction to proceed in the direction of the micrometer 46, the force clamping the spring 47 increases, and if the moving member 41 is rotated in the reverse direction to proceed in the direction of the nozzle member 10, the force clamping the spring 47 decreases. That is, the elastic force of the spring 47 which causes the moving member 41 to regulate the rearward movement speed of the plunger is adjusted. In this manner, it is possible to adjust the rearward movement speed of the plunger by independently adjusting the stroke of the plunger.

The rod portion 30 of the plunger is configured to have a large-diameter portion and a small-diameter portion. The small-diameter portion is inserted into the guide 45 arranged below the moving member 41, and is guided so as not to be shaken rightward and leftward. The front end surface of the large-diameter portion of the rod portion 30 forms the front contact portion 32.

The most forward movement position of the plunger is determined by the front contact portion 32 coming into contact with the front stopper 56 which forms the rear end portion of the position determining member 40. The position determining member 40 is arranged between the guide 45 and the discharging unit 57. The position determining member 40 is configured to have a front projection having a cylindrical shape, a rear projection having a cylindrical shape and a disk-shaped rotary knob which connects these projections. A through hole is disposed on a central axis of the position determining member 40, and the small-diameter portion of the rod portion 30 of the plunger is inserted into the through hole.

According to the apparatus of Example 5 as described above, it is possible not only to adjust the most forward movement position of the plunger, but also to adjust the rearward movement speed of the plunger by adjusting the elastic force of the spring 47.

Example 6

An apparatus of Example 6 is different from the apparatus of Example 5 in that there is provided a flow control valve 73. That is, in addition to the mechanism for adjusting the biasing force of the spring 47 using the moving member 41, the apparatus of Example 6 can adjust the rearward movement speed of the piston 33 using the flow control valve 73.

Figure 6:
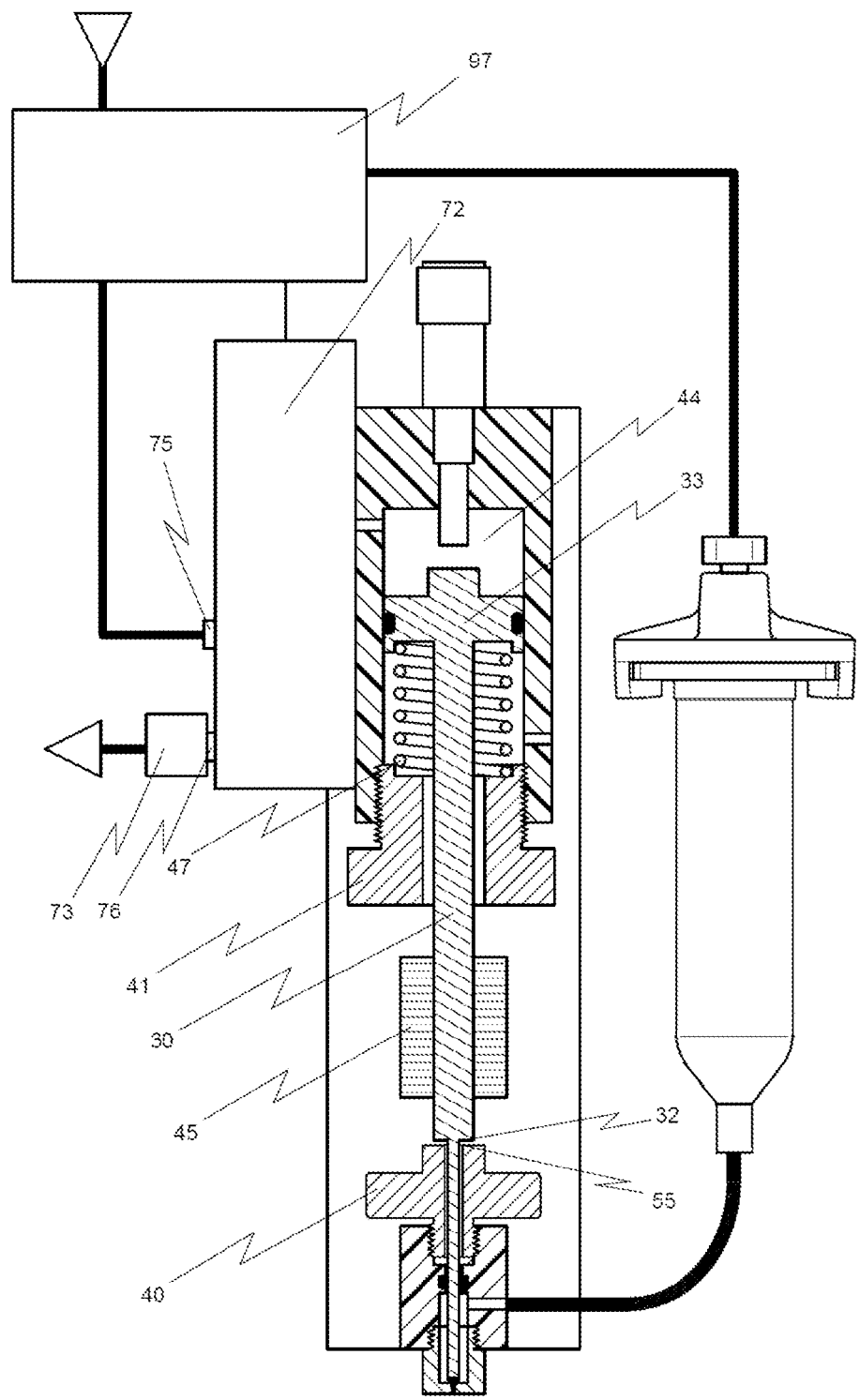
FIG. 6 is a configuration diagram of an apparatus in Example 6.

FIG. 6 is a configuration diagram of the apparatus in Example 6. In the apparatus of FIG. 6, the flow control valve is connected to an air ejection port 76 of the electromagnetic switching valve 72. If the electromagnetic switching valve 72 is located at the second position where the rear piston chamber 44 and the air ejection port 76 communicate with each other, the compressed air inside the rear piston chamber 44 is ejected from the air ejection port 76. At this time, it is possible to control the rearward movement speed of the plunger by controlling the flow rate of the air election using the flow control valve 73.

Example 7

Example 7 discloses an apparatus including the flow control valve 73 at a position different from that of the apparatus in Example 6.

Figure 7:
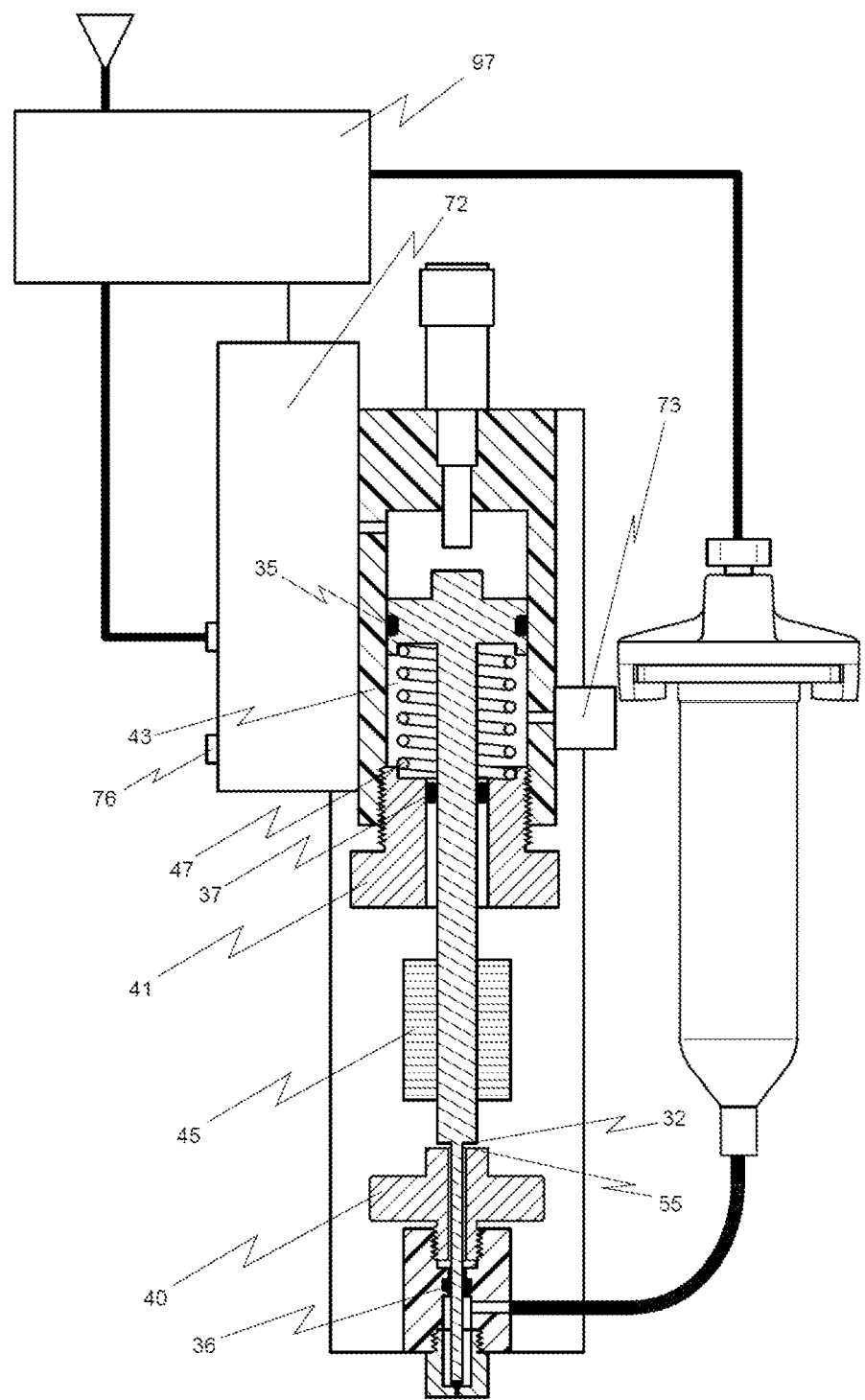
FIG. 7 is a configuration diagram of an apparatus in Example 7.

FIG. 7 is a configuration diagram of the apparatus in Example 7. In the apparatus of Example 7, the flow control valve 73 is arranged in an opening disposed on a side of the front piston chamber 43. In addition, in this example, a rear portion of the moving member 41 configures a wall surface of the front piston chamber 43. A sealing member C37 is disposed in a through hole (hole into which the rod portion 30 is inserted) disposed on the central axis of the moving member 41, thereby allowing the front piston chamber 43 to be air-tight and enhancing an adjustment effect achieved by the flow control valve 73.

In Example 7, it is possible to adjust the rearward movement speed of the piston 33 by controlling a deflection degree of the spring 47 using the moving member 41, and it is possible to adjust the rearward movement speed of the piston 33 by controlling the flow rate of the air flowing in the front piston chamber 43.

A second flow control valve may be disposed in the air ejection port 76 of the electromagnetic switching valve 72, and the rearward movement speed of the plunger may be controlled by two flow control valves.

Example 8

Example 8 discloses an apparatus which employs a tension coil spring as the spring (elastic body) 47.

Figure 8:
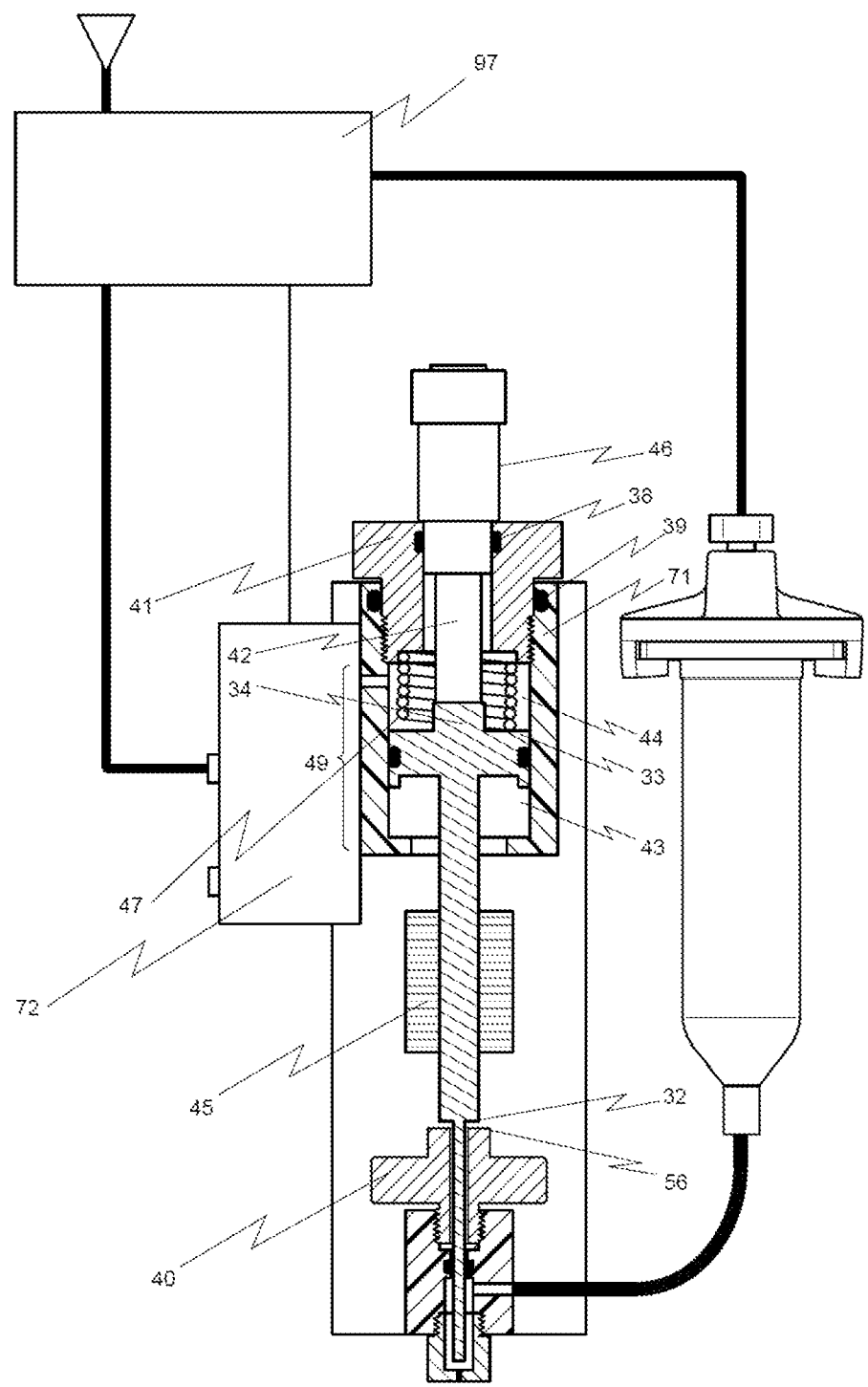
FIG. 8 is a configuration diagram of an apparatus in Example 8.

FIG. 8 is a configuration diagram of the apparatus in Example 8. In the apparatus of Example 8, the spring 47 which is the tension coil spring is arranged inside the rear piston chamber 44, and is held by being interposed between the piston 33 and the moving member 41. That is, in the spring 47, one end thereof is attached to the rear portion of the piston 33 and the other end is attached to the front portion of the moving member 41, thereby applying the biasing force against the piston 33 in the rearward movement direction.

The moving member 41 is screwed to and inserted into the upper portion (rear portion) of the main body 71, and the lower portion (front portion) of the moving member 41 forms a wall surface of the rear piston chamber 44. It is possible to change the size of the piston chamber 49 by using the screw mechanism (position adjustment mechanism) configured to have the outer peripheral screw groove of the moving member 41 and the inner peripheral screw groove of the lower end portion of the main body 71.

A sealing member D38 is disposed in a through hole disposed on the central axis of the moving member 41, and a sealing member E39 is disposed between the main body 71 and the moving member 41, thereby allowing the rear piston chamber 44 to be air-tight. The micrometer 46 is inserted into the through hole disposed on the central axis of the moving member 41. The rear stopper 42 connected to the micrometer 46 is relatively moved with respect to the moving member 41 and comes into contact with the piston 33, thereby determining the most rearward movement position.

If the micrometer 46 is rotated in the forward direction and the position of the rear stopper 42 with respect to the moving member 41 is moved forward, the spring 47 is largely stretched, thereby enabling the piston 33 to move rearward faster.

If the micrometer 46 is rotated in the reverse direction and the position of the rear stopper 42 with respect to the moving member 41 is moved rearward, the spring 47 is less stretched, thereby enabling the piston 33 to move rearward more gradually.

The movement distance (stroke) of the plunger ranges from the position where the rear contact portion 34 comes into contact with the rear stopper 42 to the position where the front contact portion 32 comes into contact with the front stopper 56. It is possible to adjust the stroke of the plunger by appropriately adjusting the position of the moving member 41, the degree of rotation of the micrometer 46 and the position of the position determining member 40. The above-described point is the same as those of other examples.

Even in this example, the position of the electromagnetic switching valve 72 is switched over to the first position to supply the compressed air to the rear piston chamber 44. In this manner, a forward movement force prevailing against the biasing force of the spring 47 is applied to the piston 33 so as to cause the plunger to move forward, thereby performing the discharging.

INDUSTRIAL APPLICABILITY

A liquid material discharge apparatus and a method for the same according to the present invention is suitable for an operation which discharges a very small amount of liquid material with high accuracy. For example, the present invention is preferably applied to a sealing coating apparatus or a liquid crystal dropping apparatus in a liquid crystal panel manufacturing process, and an apparatus for applying a solder paste to a printed board.

The present invention can be applied to both of a method of causing a plunger (valve body) to collide with a valve seat (inner wall of liquid chamber) so as to discharge in a flying way a liquid material through a nozzle, and a method of causing the plunger to move fast and rapidly stopping the plunger without being collided with the valve seat so as to apply an inertia force to the liquid material and to discharge in a flying way the liquid material through the nozzle.

REFERENCE SIGNS LIST 10 nozzle member
11 discharging port
12 discharging path
30 rod portion
31 front end portion
32 front contact portion
33 piston
34 rear contact portion
35 sealing member A
36 sealing member B
37 sealing member C
38 sealing member D
39 sealing member E
40 position determining member
41 moving member
42 rear stopper
43 front piston chamber
44 rear piston chamber
45 guide
46 micrometer
47 spring (elastic body)
48 spring chamber
49 piston chamber
50 liquid chamber
51 insertion hole
52 liquid feeding path
53 liquid feeding tube
54 fixing screw
55 slot
56 front stopper
57 discharging unit
70 base
71 main body
72 electromagnetic switching valve
73 flow control valve
75 air supply port
76 air ejection port
80 storage container
90 control unit
91 pressure regulator (pressure reducing valve)
92 buffer tank
93 pressure intensifier (booster valve)

94 pressure supply source
95 pressure regulator
96 pressure regulator B
97 controller
98 electromagnetic switching valve B
99 pressure reducing valve B

The invention claimed is:

1. A liquid material discharging apparatus comprising:
a liquid chamber which communicates with a discharging port and to which a liquid material is supplied, the liquid chamber having a side wall;
a plunger whose rear end portion has a piston and whose front portion moves forward and rearward inside the liquid chamber, the front portion being thinner than the liquid chamber such that the front portion does not contact the side wall of the liquid chamber;
an elastic body which applies a biasing force to the plunger; and
a pressurizing chamber in which the piston is arranged and to which compressed gas is supplied,
wherein the liquid material is discharged through the discharging port by causing the plunger to move forward,
wherein the elastic body biases the plunger in a rearward movement direction,
wherein the compressed gas supplied to the pressurizing chamber applies a driving force to the piston to cause the plunger to move forward, and the air pressure of the pressurizing chamber can be adjusted, and
wherein a lateral surface of the plunger does not contact the side wall of the liquid chamber when the plunger is advanced.

2. The liquid material discharging apparatus according to claim 1 further comprising:
a stroke adjustment mechanism which comes into contact with the piston and adjusts the most rearward movement position of the piston.

3. The liquid material discharging apparatus according to claim 1, further comprising:
a biasing force adjustment mechanism which includes a moving member holding the elastic body by opposing the piston and a position adjustment mechanism adjusting a position of the moving member, and which adjusts a biasing force of the elastic body.

4. The liquid material discharging apparatus according to claim 1, further comprising:
a flow valve which controls a flow rate of the compressed gas ejected from the pressurizing chamber.

5. The liquid material discharging apparatus according to claim 1,
wherein the pressurizing chamber is divided into two airtight spaces by the piston; and
wherein the liquid material discharge apparatus further includes a flow valve which controls a flow rate of gas flowing in the pressurizing chamber when the piston rises.

6. The liquid material discharging apparatus according to claim 1, further comprising:
a nozzle member in which the liquid chamber is arranged; and
a body in which the pressurizing chamber is arranged and to which the nozzle member is fixed.

7. The liquid material discharging apparatus according to claim 1, further comprising:
a pressure intensifier which intensifies a pressure of the compressed gas to be supplied to the pressurizing chamber; and
a pressure regulator which reduces a pressure of the compressed gas whose pressure is intensified by the pressure intensifier, to be a desired pressure, and which supplies the compressed gas to the pressurizing chamber.

8. The liquid material discharging apparatus according to claim 7,
wherein a buffer tank is disposed in a flow path which allows the pressure intensifier and the pressurizing chamber to communicate with each other.

9. The liquid material discharging apparatus according to claim 1, further comprising:
a position determining mechanism which includes a contact portion disposed in the plunger and a position determining member opposing the contact portion, and which determines the most forward movement position of the plunger.

10. The liquid material discharging apparatus according to claim 9,
wherein the contact portion comprises a convex member disposed in a forward movement direction of the piston, and the position determining member comprises a wall surface opposing the piston of the pressurizing chamber.

11. The liquid material discharging apparatus according to claim 9, further comprising:
a distance adjustment mechanism which adjusts a distance between the position determining member and the pressurizing chamber.

12. The liquid material discharging apparatus according to claim 11,
wherein the contact portion comprises a convex member disposed in a forward movement direction of the piston.

13. The liquid material discharging apparatus according to claim 12,
wherein the plunger has a rod portion connecting the piston and the front portion, and the contact portion is disposed in the rod portion.

14. A liquid material discharge method of using a liquid material discharging apparatus that includes a liquid chamber which communicates with a discharging port and to which a liquid material is supplied, the liquid chamber having a side wall; a plunger whose rear end portion has a piston and whose front portion moves forward and rearward inside the liquid chamber, the front portion being thinner than the liquid chamber such that the front portion does not contact the side wall of the liquid chamber; an elastic body which applies a biasing force to the plunger; and a pressurizing chamber in which the piston is arranged and to which compressed gas is supplied, the method comprising:
a filling process of causing the plunger to move in a rearward movement direction by ejecting the compressed gas inside the pressurizing chamber; and
a discharging process of causing the plunger to move forward at a desired speed by supplying the compressed gas which is adjusted to have a desired pressure to the pressurizing chamber,
wherein in the discharging process, a lateral surface of the plunger does not contact the side wall of the liquid chamber when the plunger is advanced.

15. The liquid material discharge method according to claim 14,
wherein the liquid material discharge apparatus further includes a flow valve which controls a flow rate of the compressed gas ejected from the pressurizing chamber; and
wherein the filling process comprises a process of controlling the flow rate of the compressed gas ejected from the pressurizing chamber.

16. The liquid material discharge method according to claim 14,
  wherein the pressurizing chamber is divided into two airtight spaces by the piston; and
  wherein the liquid material discharge apparatus further includes a flow valve which controls a flow rate of gas flowing in the pressurizing chamber when the piston rises; and
  wherein the filling process comprises a process of controlling the flow rate of the gas flowing into the pressurizing chamber.

17. The liquid material discharging apparatus according to claim 1, further comprising:
  a liquid feeding path which establishes a constant connection between the liquid chamber and a storage container.

18. The liquid material discharge method according to claim 14,
  wherein the liquid material discharge apparatus further includes a liquid feeding path which establishes a constant connection between the liquid chamber and a storage container.

19. The liquid material discharge method according to claim 14,
  wherein the liquid material discharge apparatus further includes a nozzle member in which the liquid chamber is arranged; and a body in which the pressurizing chamber is arranged and to which the nozzle member is fixed.

20. The liquid material discharge method according to claim 14,
  wherein the liquid material discharge apparatus further includes a position determining mechanism which includes a contact portion disposed in the plunger and a position determining member opposing the contact portion, and which determines the most forward movement position of the plunger; and
  wherein the liquid material is discharged in a droplet state after applying inertia force to the liquid material by causing the plunger to move forward in a state where the front portion of the plunger and an inner wall of the liquid chamber are not in contact with each other.

21. The liquid material discharge method according to claim 20,
  wherein the discharging process comprises:
  a process of extruding the liquid material having an amount required for forming a desired droplet from the discharging port by causing the plunger to move forward to the most forward movement position where the plunger is not in contact with the liquid chamber; and
  a process of forming a very small amount of droplets after dividing the liquid material extruded from the discharging port by subsequently causing the plunger to move rearward.

22. The liquid material discharge method according to claim 14,
  wherein the liquid material discharge apparatus further includes a pressure intensifier which intensifies a pressure of the compressed gas to be supplied to the pressurizing chamber, and a pressure regulator which reduces a pressure of the compressed gas whose pressure is intensified by the pressure intensifier, to be a desired pressure, and which supplies the compressed gas to the pressurizing chamber; and
  wherein the discharging process comprises a process of supplying the compressed gas whose pressure has been regulated.

23. The liquid material discharge method according to claim 22,
  wherein a buffer tank is disposed in a flow path which allows the pressure intensifier and the pressurizing chamber to communicate with each other.

* * * * *